(12) United States Patent
Hirata

(10) Patent No.: US 7,432,700 B2
(45) Date of Patent: Oct. 7, 2008

(54) SURFACE INSPECTION APPARATUS

(75) Inventor: Hiroyuki Hirata, Tokyo-to (JP)

(73) Assignee: Kabushiki Kaisha TOPCON, Tokyo-to (JP)

( * ) Notice: Subject to any disclaimer, the term of this patent is extended or adjusted under 35 U.S.C. 154(b) by 866 days.

(21) Appl. No.: 10/999,021

(22) Filed: Nov. 29, 2004

(65) Prior Publication Data

US 2005/0126314 A1    Jun. 16, 2005

(30) Foreign Application Priority Data

Dec. 16, 2003   (JP)   ............... 2003-417534

(51) Int. Cl.
*G01R 31/00* (2006.01)

(52) U.S. Cl. .................................. 324/158.1

(58) Field of Classification Search ................... None
See application file for complete search history.

(56) References Cited

U.S. PATENT DOCUMENTS

| | | | | |
|---|---|---|---|---|
| 4,626,101 A | * | 12/1986 | Ogawa et al. | 356/237.2 |
| 6,160,615 A | * | 12/2000 | Matsui et al. | 356/237.4 |
| 6,768,542 B2 | * | 7/2004 | Ise et al. | 356/237.2 |

FOREIGN PATENT DOCUMENTS

| | | |
|---|---|---|
| EP | 0 458 246 | 11/1991 |
| JP | 4-69129 | 3/1992 |
| JP | 2729297 | 12/1997 |
| JP | 2846423 | 10/1998 |
| JP | 2004-226109 | 8/2004 |

OTHER PUBLICATIONS

The European Search Report dated Dec. 21, 2006.

* cited by examiner

*Primary Examiner*—Vinh P Nguyen
(74) *Attorney, Agent, or Firm*—Nields & Lemack

(57) ABSTRACT

A surface inspection apparatus, comprising a wafer table rotated by a motor, a pair of clamp arms rotatably mounted with respect to the wafer table, pushing means for pushing the clamp arms so as to rotate in the direction toward the center, positioning seats in arcuate shape mounted on the wafer table where a peripheral portion of a wafer is placed, and clamp pawls in arcuate shape coming into contact with a peripheral edge of the wafer, wherein the clamp arms are rotated around positions which are different from the rotation center of the motor, the clamp pawls are separated from the positioning seats when the clamp arm is rotated on a position opposite to the center, and the peripheral edge of the wafer is clamped between the positioning seats and the clamp pawls when the clamp arm is in clamping condition.

7 Claims, 9 Drawing Sheets

SURFACE INSPECTION APPARATUS

BACKGROUND OF THE INVENTION

The present invention relates to a surface inspection apparatus for inspecting foreign objects attached on a substrate such as a wafer and flaws on the surface of the substrate in a process to manufacture semiconductor device. In particular, the present invention relates to a surface inspection apparatus provided with an inspection stage, on which centering of the substrate can be performed.

Various types of semiconductor devices are manufactured by forming a number of semiconductor elements on a semiconductor wafer such as silicon. With the progress in high-density integration, the fabricating process is being changed to produce more and more micro-sized products. To increase the production yield, wafers with large diameters are more and more being produced.

With the progress of high-density integration and with the production of more and more micro-sized products, foreign objects attached on the wafer or presence of flaws on the wafer surface exert big influence on product quality and production yield. For this reason, inspection process is now incorporated into the process to manufacture the semiconductor products. Surface inspection is performed on the wafers by using a surface inspection apparatus, and attaching condition of foreign objects and presence or absence of flaws on the surface of wafers are inspected.

A surface inspection apparatus for wafers has an inspection stage to hold wafers. The inspection stage is rotated at high speed. Laser beams are projected to the surface of the wafer rotated at high speed, and the surface is scanned by the laser beams in circumferential direction. The laser beams reflected by the wafer surface are received, and attachment of foreign objects or presence or absence of flaws on the surface are detected from the reflecting conditions.

As described above, wafers with increasingly larger diameter are now produced. On the other hand, there is such demand that inspection time is gradually reduced to improve the productivity. The rotating speed of wafers during inspection is also increased. Therefore, high centrifugal force is applied on the held wafer when the wafer is inspected. Also, the amount of decentering between the wafer center and the rotation center of the inspection stage gives big influence on the centrifugal force to be applied on the wafers.

Further, when foreign objects or flaws are detected on the surface of wafer, the position (i.e. coordinates) of the foreign object or flaw is given by using the center of wafer and an orientation flat or notch as reference. The center of wafer is determined by using the edge as reference. The edge of the wafer is held on the surface inspection apparatus and is detected under rotating condition. If the amount of decentering of the wafer is high, the wafer edge is moved extensively, and it is difficult to detect the edge accurately. The accuracy of the reference coordinates is worsened and this may cause damage on the wafer. As a result, the accuracy of information on the position of the detected foreign object or flaw is also decreased.

In this connection, the center of the wafer must be accurately aligned with the rotation center of the inspection stage when the wafer is held on the surface inspection apparatus.

In the past, a centering device has been used in addition to the surface inspection apparatus for the centering of the wafer. Wafer centering is performed by using the centering device, and then, the wafer is shifted to the surface inspection apparatus by a wafer transportation mechanism. Thus, the centering of the wafer on the centering device is reflected when the wafer is held by the surface inspection apparatus.

However, the wafer centering as practiced in the past has the following disadvantages:

The wafer centering is performed by using the centering device, which is separately furnished. This means that the centering device is needed and also a process for centering is required. Error may occur when the process is shifted from the centering device to the surface inspection apparatus.

Positioning between the surface inspection apparatus and the centering device must be carried out via a wafer transportation mechanism, and this causes problems such as difficulty in adjustment.

As a surface inspection apparatus for carrying out position alignment, centering, etc. of wafers before inspection, the apparatuses disclosed in the Japanese Patent Publications 2729297 and 2846423 have been known, for instance.

SUMMARY OF THE INVENTION

It is an object of the present invention to provide a surface inspection apparatus, by which it is possible to perform wafer centering by the surface inspection apparatus itself and centering and chucking of wafers can be carried out reliably, rapidly and with high accuracy.

To attain the above object, the surface inspection apparatus according to the present invention comprises a wafer table rotated by a motor, a pair of clamp arms rotatably mounted with respect to the wafer table, pushing means for pushing the clamp arms so as to rotate in the direction toward the center, positioning seats in arcuate shape mounted on the wafer table where a peripheral portion of a wafer is placed, and clamp pawls in arcuate shape coming into contact with a peripheral edge of the wafer, wherein the clamp arms are rotated around positions which are different from the rotation center of the motor, the clamp pawls are separated from the positioning seats when the clamp arm is rotated on a position opposite to the center, and the peripheral edge of the wafer is clamped between the positioning seats and the clamp pawls when the clamp arm is in clamping condition. Also, the present invention provides the surface inspection apparatus as described above, wherein two or more positioning seats with different diameters are arranged on the wafer table concentrically and in multiple circular arrangement, clamp pawls with diameters corresponding to diameters of the positioning seats are provided concentrically and in multiple circular arrangement on the clamp arms, and heights of the positioning seats are gradually reduced toward the center. Further, the present invention provides the surface inspection apparatus as described above, wherein the clamp arm is pushed by centrifugal force so that the clamp arm is rotated in the direction toward the center when centrifugal force is applied on the clamp arm. Also, the present invention provides the surface inspection apparatus as described above, wherein the clamp pawl has a downwardly inclined surface, and the inclined surface comes into contact with the peripheral edge of the wafer. Further, the present invention provides the surface inspection apparatus as described above, wherein the positioning seat has a horizontal surface where the wafer is placed and also has an inclined surface continuous from the horizontal surface toward the center. Also, the present invention provides the surface inspection apparatus as described above, wherein a light passing portion is formed on the wafer table and a wafer sensor with an optical axis passing through the light passing portion is provided so that an edge of the wafer can be detected by the wafer sensor and it is detected whether a wafer is present or not. Further, the present invention provides the surface inspection apparatus as described above, wherein an orientation flat or notch is detected by the wafer sensor, and posture of the wafer in a rotating direction is detected.

According to the present invention, a surface inspection apparatus is provided, which comprises a wafer table rotated by a motor, a pair of clamp arms rotatably mounted with respect to the wafer table, pushing means for pushing the clamp arms so as to rotate in the direction toward the center, positioning seats in arcuate shape mounted on the wafer table where a peripheral portion of a wafer is placed, and clamp pawls in arcuate shape coming into contact with peripheral edge of the wafer, wherein the clamp arms are rotated around positions which are different from the rotation center of the motor, the clamp pawls are separated from the positioning seats when the clamp arm is rotated on a position opposite to the center, and the peripheral edge of the wafer is clamped between the positioning seats and the clamp pawls when the clamp arm is in clamping condition. As a result, clamping of wafers and aligning of wafers can be performed at the same time, and there is no need to use alignment device or alignment process.

According to the present invention, a surface inspection apparatus is provided, wherein two or more positioning seats with different diameters are arranged on the wafer table concentrically and in multiple circular arrangement, clamp pawls with diameters corresponding to diameters of the positioning seats are provided concentrically and in multiple circular arrangement on the clamp arms, and heights of the positioning seats are gradually reduced toward the center. As a result, wafers with different sizes can be inspected by use of a single inspection apparatus.

According to the present invention, a surface inspection apparatus is provided, wherein the clamp arm is pushed by centrifugal force so that the clamp arm is rotated in the direction toward the center when centrifugal force is applied on the clamp arm. As a result, clamping of wafers is not released during inspection.

According to the present invention, a surface inspection apparatus is provided, wherein the clamp pawl has a downwardly inclined surface, and the inclined surface comes into contact with the peripheral edge of the wafer. Therefore, even when there is dimensional error in outer diameter of a wafer, the wafer can be clamped reliably and firmly.

DETAILED DESCRIPTION OF THE PREFERRED EMBODIMENT

Figure 1:
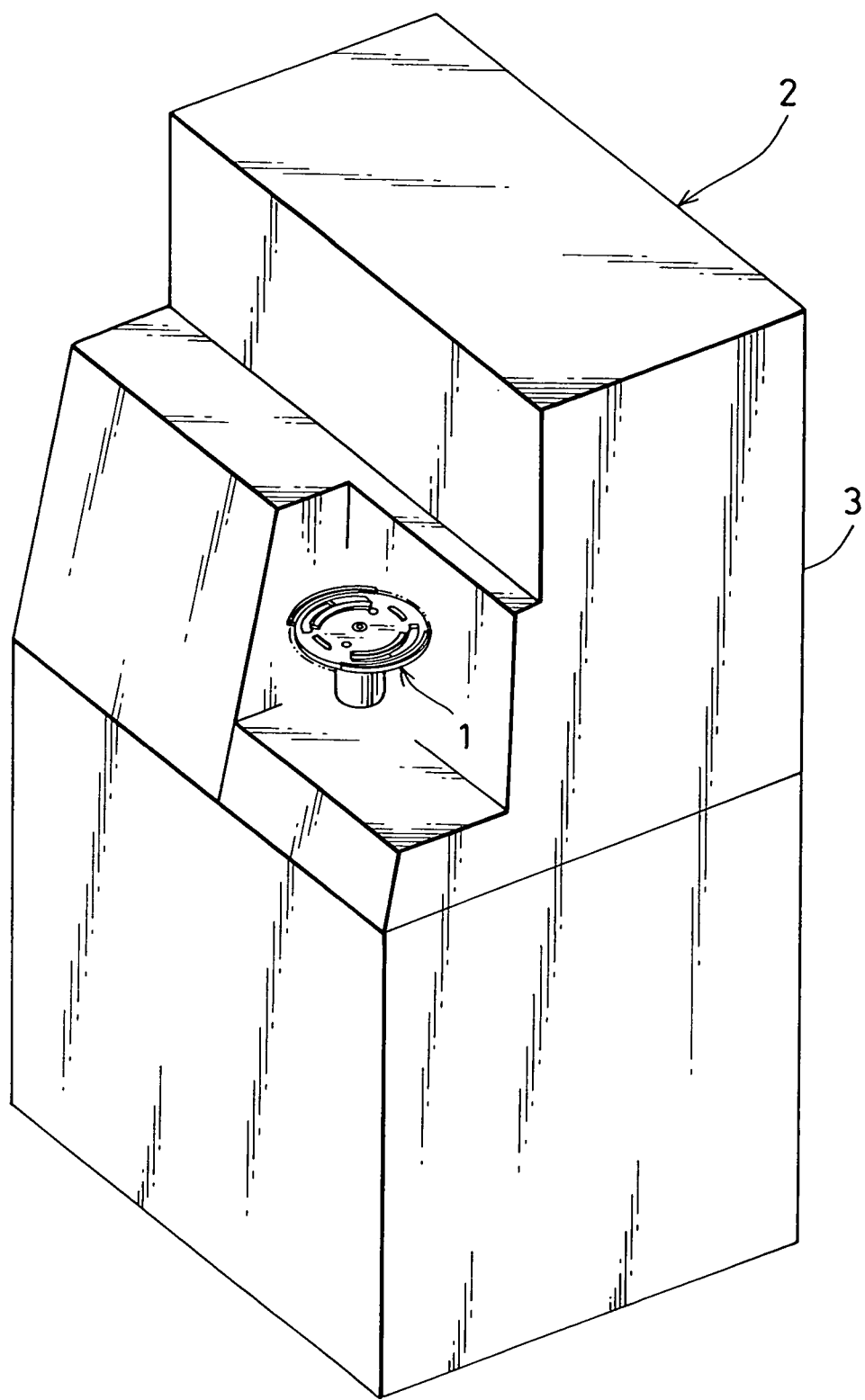
FIG. 1 is a schematical drawing to show an external appearance of an embodiment of the present invention.
Figure 2:
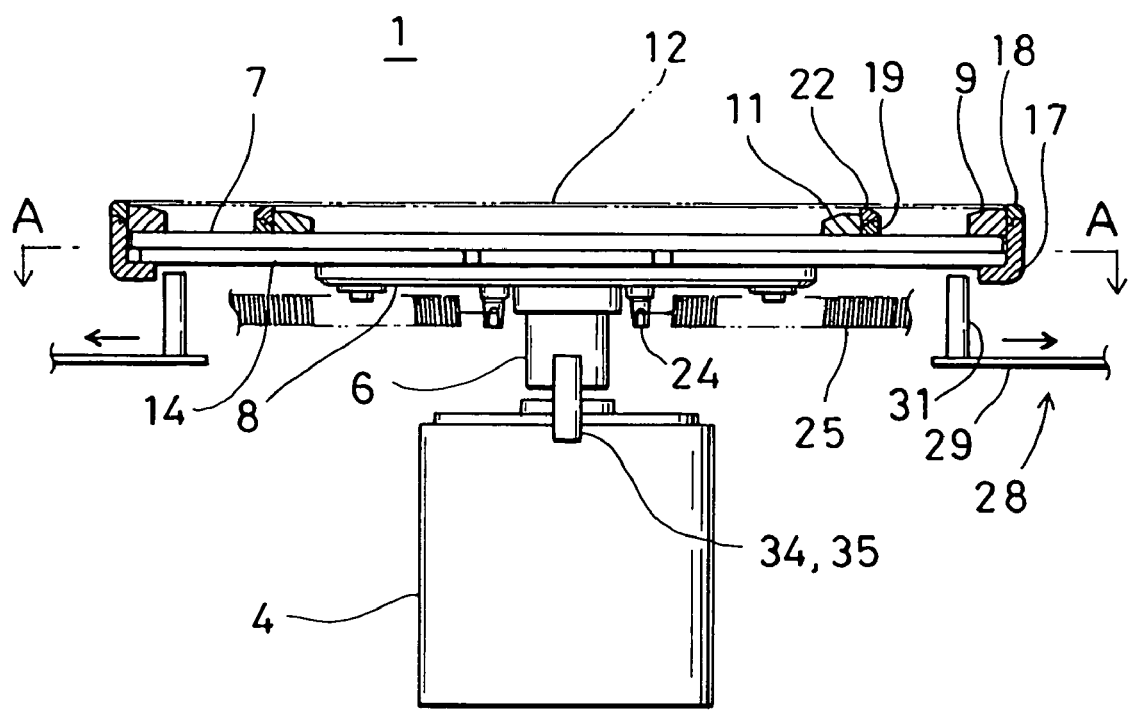
FIG. 2 is a side view showing an essential portion of the embodiment of the present invention.
Figure 3:
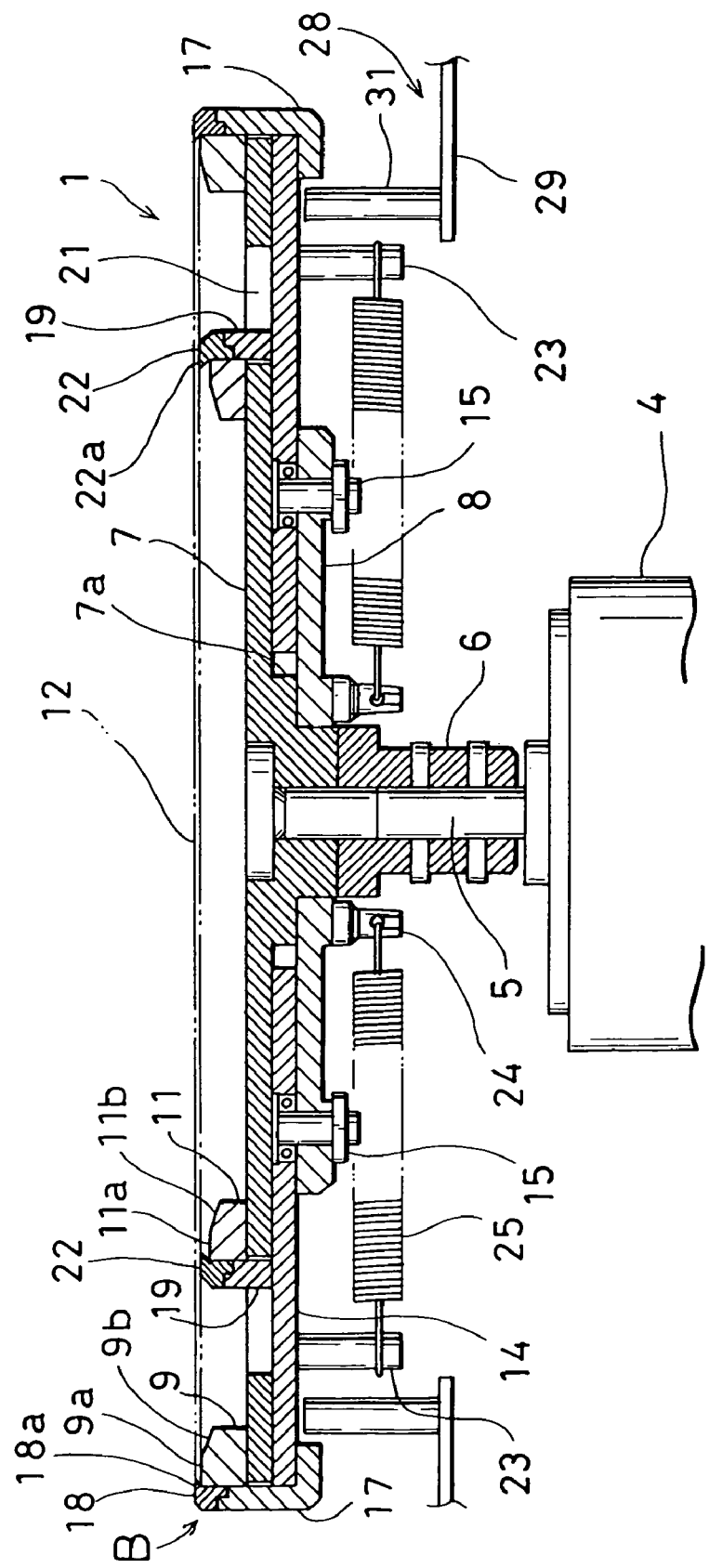
FIG. 3 is a cross-sectional view of an essential portion of the embodiment of the present invention.

Description will be given below on the best mode for carrying out the present invention referring to the drawings.

FIG. 1 shows a surface inspection apparatus 2 provided with an inspection stage 1. The surface inspection apparatus 2 is accommodated in a housing 3. Although not shown in the figure, there are provided in the housing 3 a driving mechanism for rotating and driving the inspection stage 1, a projecting optical system for projecting a detection light to a wafer held on the inspection stage 1, a photodetecting optical system for receiving a light such as a scattered light reflected by a surface of the wafer, an inspection unit for inspecting foreign objects attached on a substrate such as a wafer or flaws on the substrate surface based on detection result of the photodetecting optical system, a control unit for controlling the driving mechanism, the inspection unit, etc., and others.

Description will be given now on the inspection stage 1 referring to FIG. 2 to FIG. 7.

A motor 4 is supported by a frame (not shown), which constitutes the housing 3. A boss 6 is fixedly mounted on a rotation shaft 5 of the motor 4. On an upper end of the boss 6, a wafer table 7 is fixed concentrically with the rotation shaft 5. A guide flange 8 is arranged on a lower side of the wafer table 7 so that a predetermined gap is formed. The guide flange 8 is fixed concentrically with the wafer table 7, and the guide flange 8 has a diameter smaller than a diameter of the wafer table 7. The guide flange 8 may be mounted on the boss 6.

On an upper surface of the wafer table 7, outer positioning seats 9 and 9 and inner positioning seats 11 and 11 are fixed concentrically and in multiple circular arrangement. Both the outer positioning seats 9 and the inner positioning seats 11 are designed in arcuate shape with the center of the rotation shaft 5 as the center of the circle. Each of these seats has a length extended over about a length of a guadant. An outer diameter of the outer positioning seat 9 is slightly longer than an outer diameter of the wafer table 7. For instance, the outer diameter of the outer positioning seat 9 is equal to an outer diameter of a wafer of 300 mm (hereinafter referred as "a large-diameter wafer 12"). An outer diameter of the inner positioning seat 11 is equal to an outer diameter of a wafer of 200 mm, for instance, (hereinafter referred as "a small-diameter wafer 13") (See FIG. 5).

On the outer positioning seat 9 and the inner positioning seat 11, there are provided horizontal surfaces 9a and 11a with required widths respectively on outer peripheries of the upper surfaces. Inclined surfaces 9b and 11b are extended continuously toward the center from the horizontal surfaces 9a and 11a respectively. A height of the horizontal surface 11a is lower than a height of the horizontal surface 9a. A peripheral edge of the large-diameter wafer 12 is placed on the horizontal surface 9a, and a peripheral edge of the small-diameter wafer 13 is placed on the horizontal surface 11a. It is designed in such manner that the inner positioning seat 11 does not contact with the large-diameter wafer 12 when the large-diameter wafer 12 is positioned on the outer positioning seat 9.

Two clamp arms 14 and 14 are slidably arranged in a relation of point symmetry between the wafer table 7 and the guide flange 8. The clamp arms 14 and 14 are rotatably mounted on the guide flange 8 via pivots 15 respectively. It is so designed that the center of gravity of the clamp arm 14 is positioned at a position closer to the forward end than the pivot 15.

The clamp arms 14 and 14 are in contact with each other with a boundary along a diameter of the wafer table 7. At the center of each of the clamp arms 14 and 14, a recessed portion 16 is formed so as not to contact with a central portion 7a of the wafer table 7 (See FIG. 6). A forward end of each of the clamp arms 14 and 14 is designed in arcuate shape to match an outer peripheral edge of the wafer table 7. At the forward end of each of the clamp arms 14 and 14, an outer pawl mounting seat 17 with approximately L-shaped cross-section is fixed on a lower surface of the clamp arm 14, and an outer clamp pawl 18 is fixed on an upper end of the outer pawl mounting seat 17. The outer clamp pawl 18 has a pawl 18a protruding in form of eaves toward the center. A lower surface of the pawl 18a is formed as a downwardly inclining surface, and the pawl 18a is overlapped on the horizontal surface 9a (See FIG. 4). The peripheral edge of the large-diameter wafer 12 is gripped between the horizontal surface 9a and the pawl 18a.

At a middle of an upper surface of each of the clamp arms 14 and 14, an inner pawl mounting seat 19 is fixed concentrically and in multiple circular arrangement with respect to the outer pawl mounting seat 17. The inner pawl mounting seat 19 penetrates an escape hole 21 formed on the wafer table 7, and an inner clamp pawl 22 is fixed on an upper end of the inner pawl mounting seat 19. Similarly to the outer clamp pawl 18, the inner clamp pawl 22 has a pawl 22a protruding in form of eaves toward the center. A lower surface of the pawl 22a is designed as a downwardly inclined surface, and the pawl 22a is overlapped on the horizontal surface 11a. The peripheral edge of the small-diameter wafer 13 is gripped between the horizontal surface 11a and the pawl 22a. The position of an upper end of the inner positioning seat 11 is lower than a lower surface of the large-diameter wafer 12 when the large-diameter wafer 12 is placed on the horizontal surface 9a.

Figure 7:
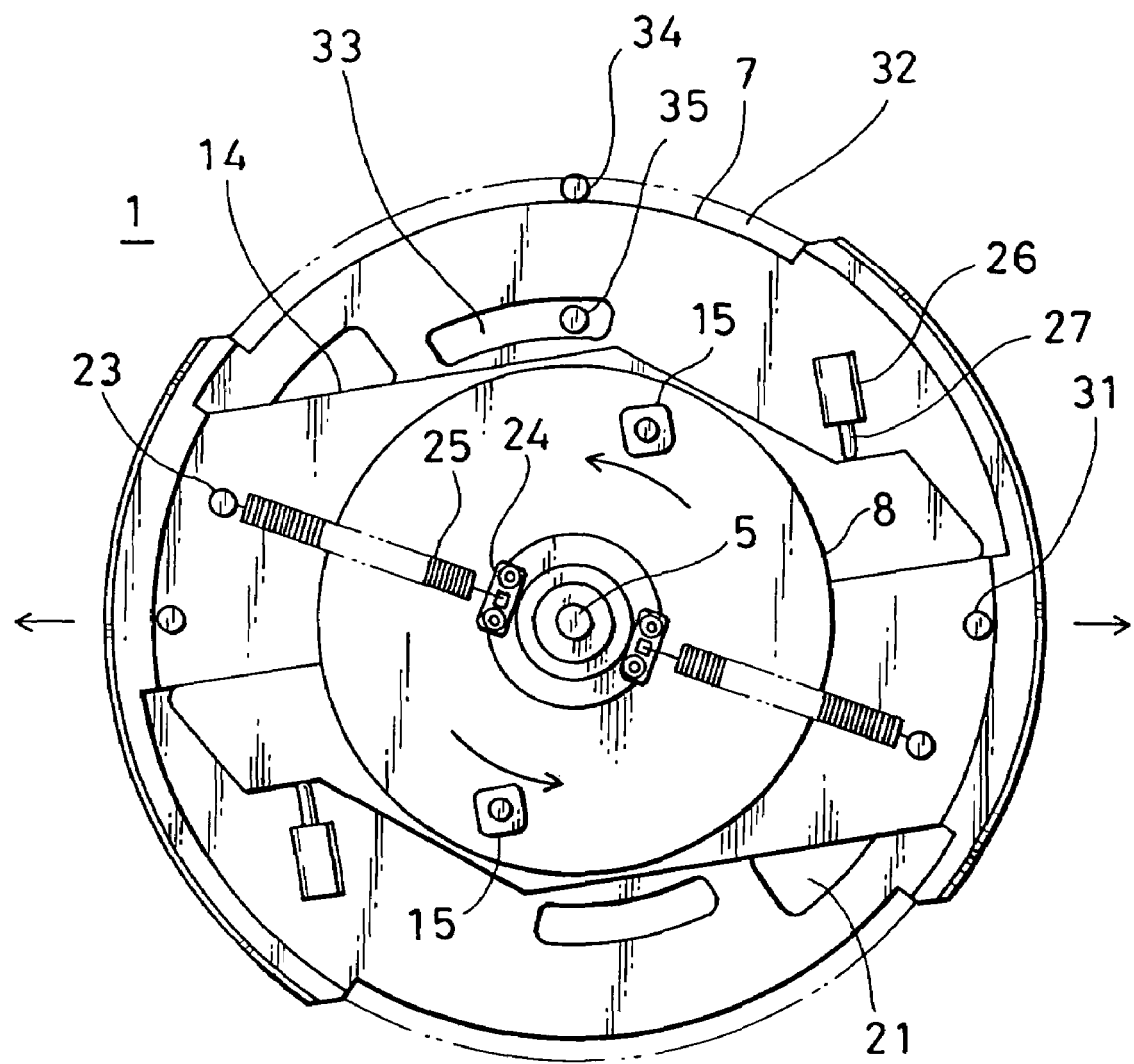
FIG. 7 is a bottom view showing an essential portion of the embodiment of the present invention.

As shown in FIG. 7, a pin 23 is erected near each of the forward end of the clamp arm 14, and spring hangers 24 are provided near the center of the guide flange 8. Springs 25 are stretched between the spring hangers 24 and the pins 23 respectively. A working line of the spring 25 passes exactly or approximately through the center of the rotation shaft 5 and almost perpendicularly crosses a radius, which passes through the center of the pivots 15. The working line of the spring 25 may not necessarily pass through exactly or approximately the center of the rotation shaft 5. It may be designed in such manner that the working line passes through a point closer to the center than the pivots 15 so that the working line causes on the clamp arms 14 a rotation moment directed toward the center.

On the lower surface of the wafer table 7, there are provided locking means 26, e.g. an air cylinder or a solenoid, each at a position opposite to a base end of the clamp arm 14. Each of the locking means 26 has a locking pin 27. Under the condition that the locking means 26 are connected with the clamp arms 14 and 14 respectively, the connecting conditions of the clamp arms 14 and 14 are locked, when the bases of the clamp arms 14 are pressed toward the center by the locking pins 27, etc.

Under the peripheral edge of the wafer table 7, there are provided a clamp releasing means 28. The clamp releasing means 28 has plates 29 supported by actuators (not shown), e.g. air cylinder or cam mechanism, etc., so that the plate 29 can be displaced in a radial direction. The clamp releasing means 28 also has releasing pins 31 erected on a forward end of each of the plate 29. The releasing pin 31 is arranged at a position closer to the center than the outer pawl mounting seat 17 so that a forward end of the releasing pin 31 is engaged with the outer pawl mounting seat 17 when the plate 29 is displaced outwardly by the actuator. Also, it is designed in such manner that the releasing pin 31 does not contact with the rotation parts such as the pin 23 and the locking means 26 when the wafer table 7 is rotated.

A light passing portion, i.e., a lacking portion 32 in arcuate shape is formed on a portion of the wafer table 7 where the outer positioning seats 9 and 9 are not arranged, and a light passing portion, i.e., an oblong hole 33 in arcuate shape is formed on a portion where the inner clamp pawl 22 is not provided. Under the wafer table 7, there are provided at least one outer wafer sensor 34 and at least one inner wafer sensor 35. An optical axis of the outer wafer sensor 34 passes through the peripheral edge of the large-diameter wafer 12, and an optical axis of the inner wafer sensor 35 passes through the peripheral edge of the small-diameter wafer 13. From above the wafer table 7, laser beams are projected along the optical axis of the outer wafer sensor 34 and along the optical axis of the inner wafer sensor 35.

Figure 8:
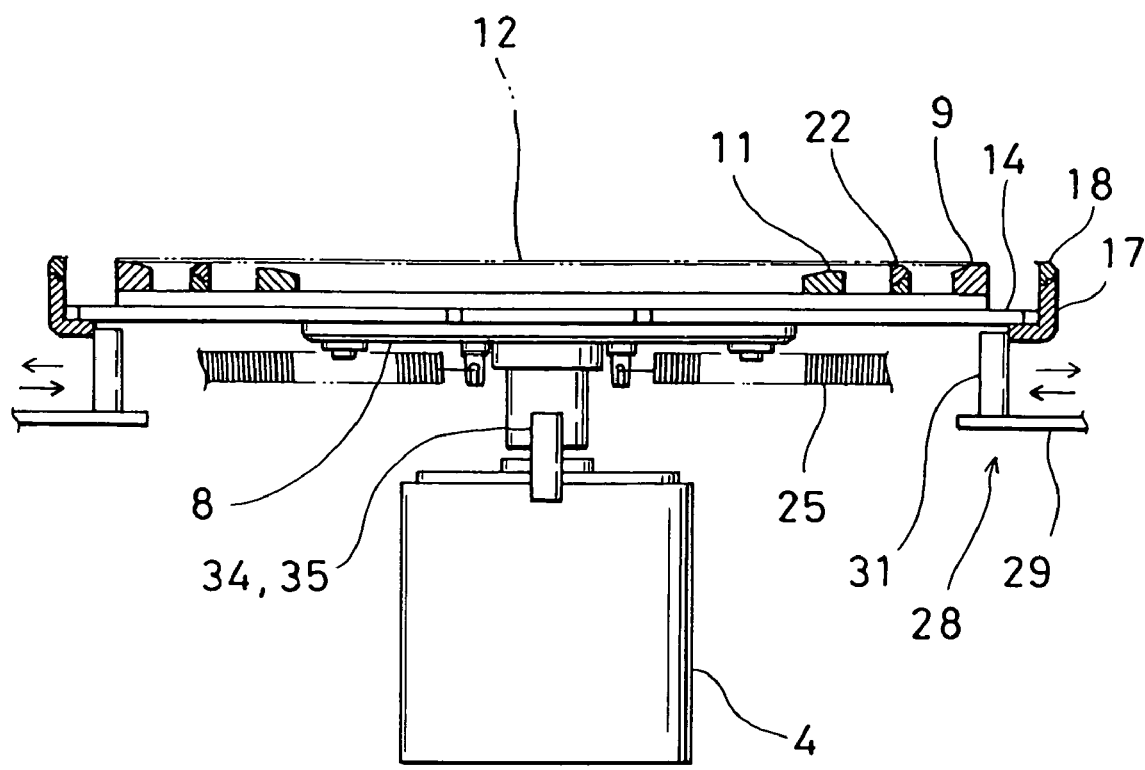
FIG. 8 is a side view of an essential portion of the embodiment of the present invention when a clamp is released.

Now, description will be given on clamping operation of the wafer by the inspection stage 1 as described above referring to FIG. 8 to FIG. 10.

A homing position where the wafer is given to or taken from the inspection stage 1 is a position where the releasing pin 31 can be brought into contact with the outer pawl mounting seat 17.

First, when the wafer (hereinafter, the wafer is regarded as the large-diameter wafer 12) is to be placed, the plate 29 is moved outward. The releasing pin 31 is engaged with the outer pawl mounting seat 17. The clamp arms 14 and 14 are moved outwardly against the resilient force of the springs 25.

Figure 9:
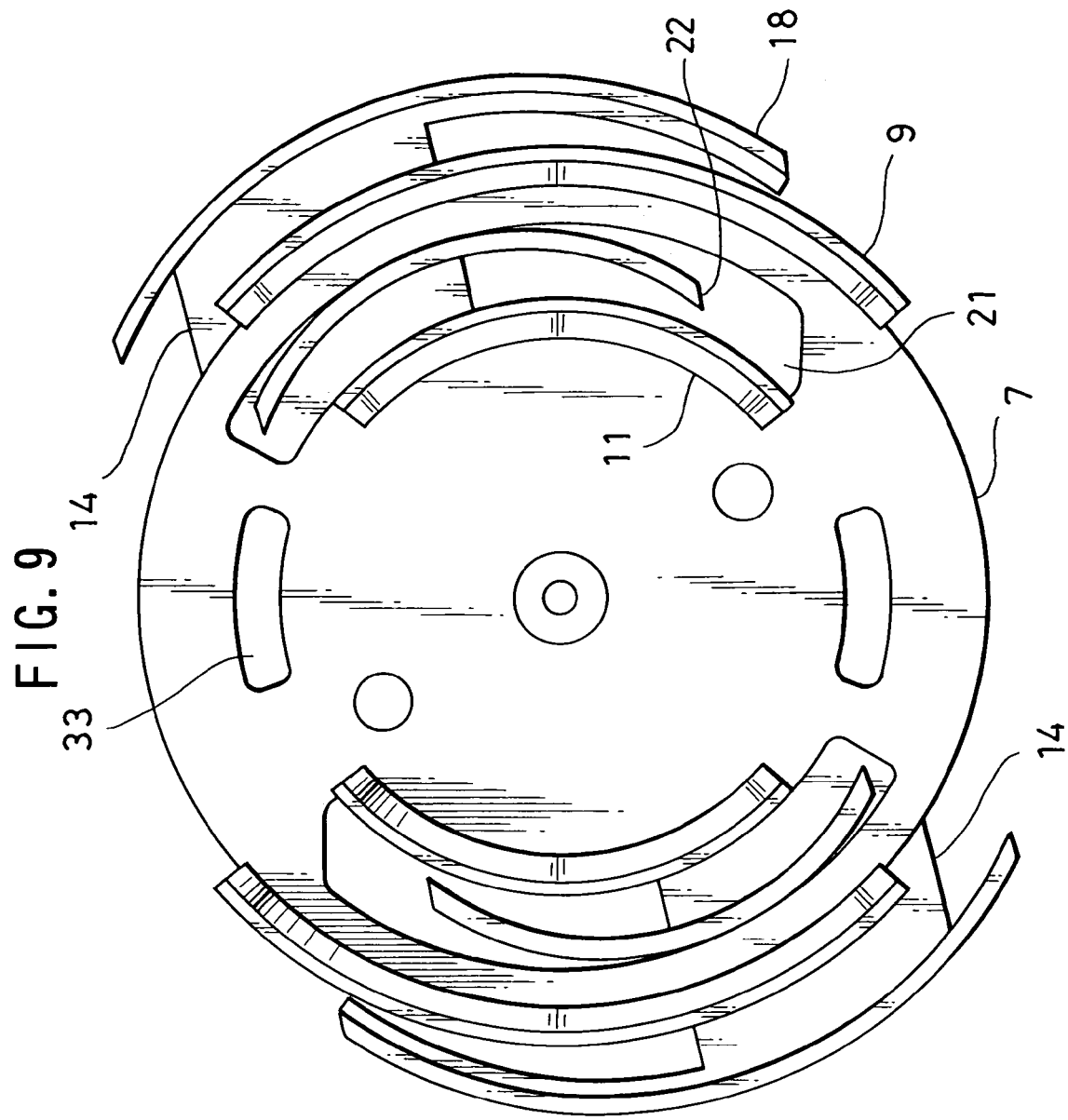
FIG. 9 is a plan view of an essential portion of the embodiment of the present invention when a clamp is released.
Figure 10:
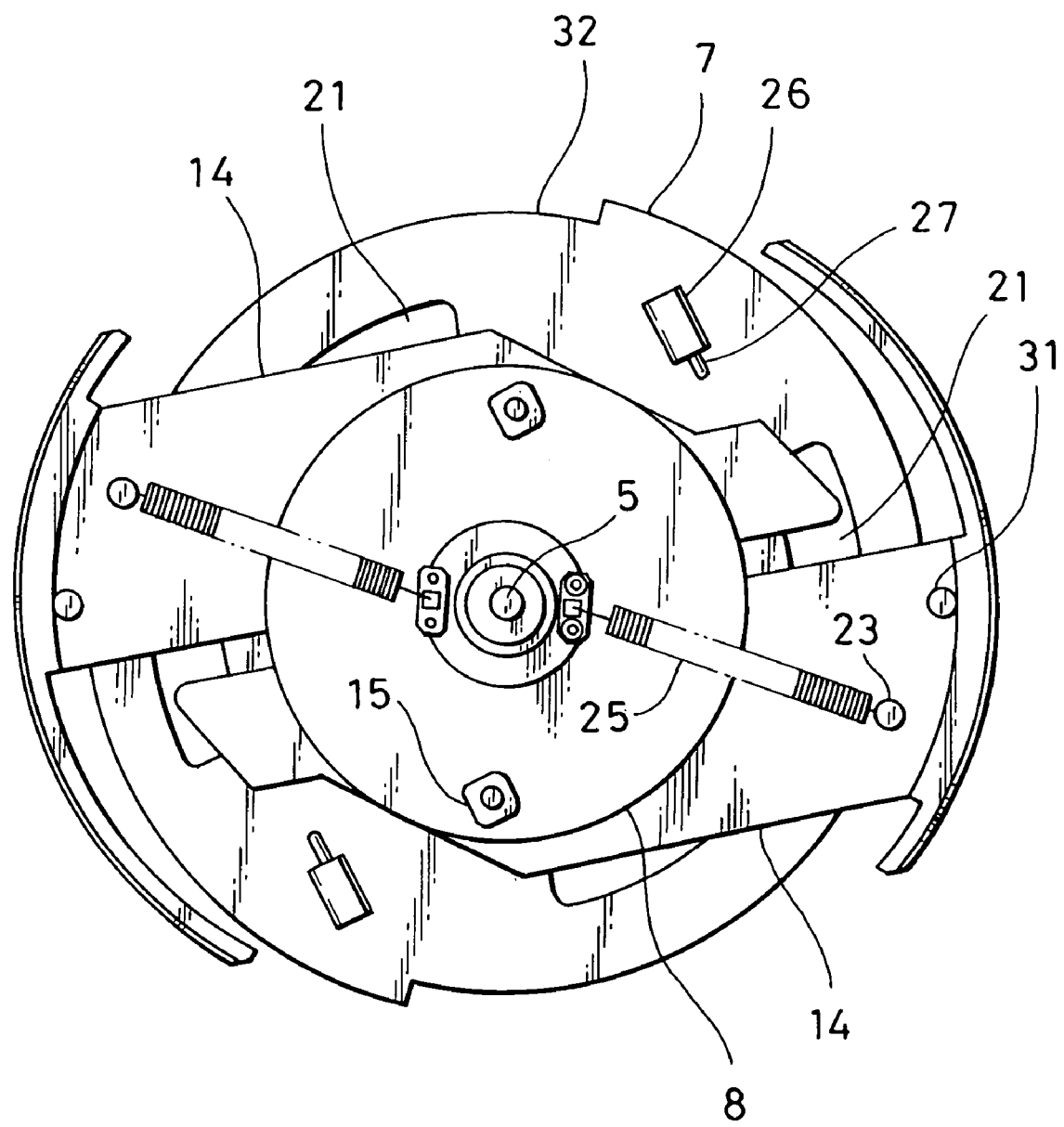
FIG. 10 is a bottom view of an essential portion of the embodiment of the present invention when a clamp is released.

The outer pawl mounting seat 17 follows after the releasing pin 31 and is moved outwardly. Then, the clamp arms 14 and 14 are rotated around the pivots 15 respectively. Because the pivot 15 is decentered with respect to the rotation shaft 5, the outer clamp pawl 18 is extensively separated outwardly from the outer positioning seat 9 as seen in FIG. 9.

The pawl 18a is retracted from the horizontal surface 9a of the outer positioning seat 9, and the space above the horizontal surface 9a is completely liberated. The large-diameter wafer 12 gripped by a robot arm (not shown) is transported between the outer positioning seat 9 and the outer positioning seat 9, and the large-diameter wafer 12 is placed on the horizontal surface 9a.

When the plate 29 is displaced toward the center after the robot arm has retracted, the clamp arms 14 and 14 follow after the movement of the releasing pin 31 due to the resilient force of the spring 25. Then, the plate 29 is fully moved toward the center, the outer pawl mounting seat 18 comes into contact with the outer positioning seat 9, and the releasing pin 31 is separated from the outer pawl mounting seat 17. When the releasing pin 31 is separated from the outer pawl mounting seat 17, the clamp arms 14 and 14 are in contact with each other.

The outer clamp pawls 18 are moved symmetrically with each other integrally with the clamp arms 14 and 14. When the large-diameter wafer 12 is deviated from the center, the outer clamp pawls 18 come into contact with the large-diameter wafer 12 from the peripheral edge of the large-diameter wafer 12 on the deviated side, and the center position of the large-diameter wafer 12 is corrected (aligned) due to the movement of the outer clamp pawls 18. When the outer clamp pawls 18 come into contact with the outer positioning seats 9, the large-diameter wafer 12 is clamped under the condition that the center of the large-diameter wafer 12 is aligned with the center of the rotation shaft 5.

Figure 4:
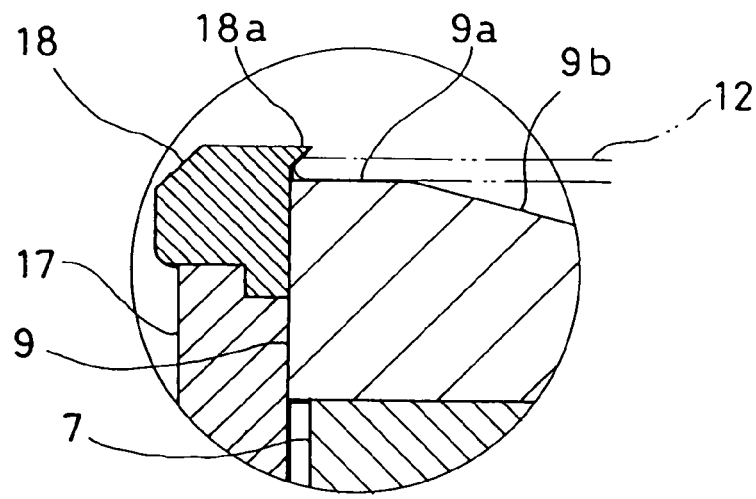
FIG. 4 is an enlarged view of a part B in FIG. 3.
Figure 5:
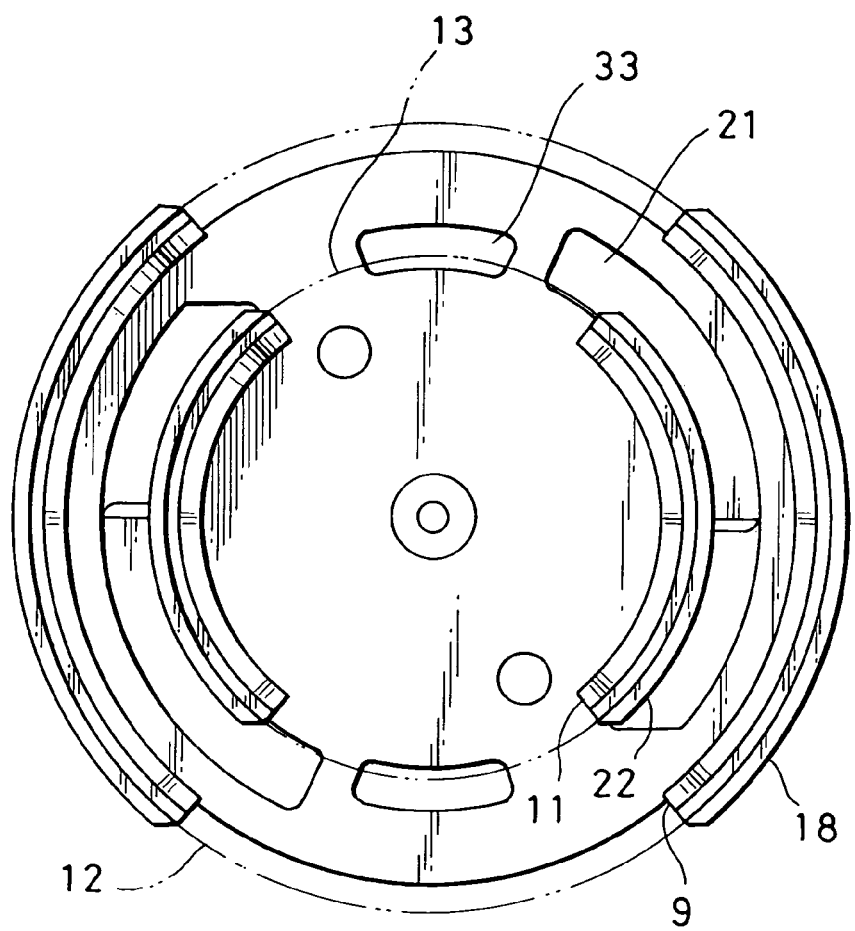
FIG. 5 is a plan view of an essential portion of an embodiment of the present invention.
Figure 6:
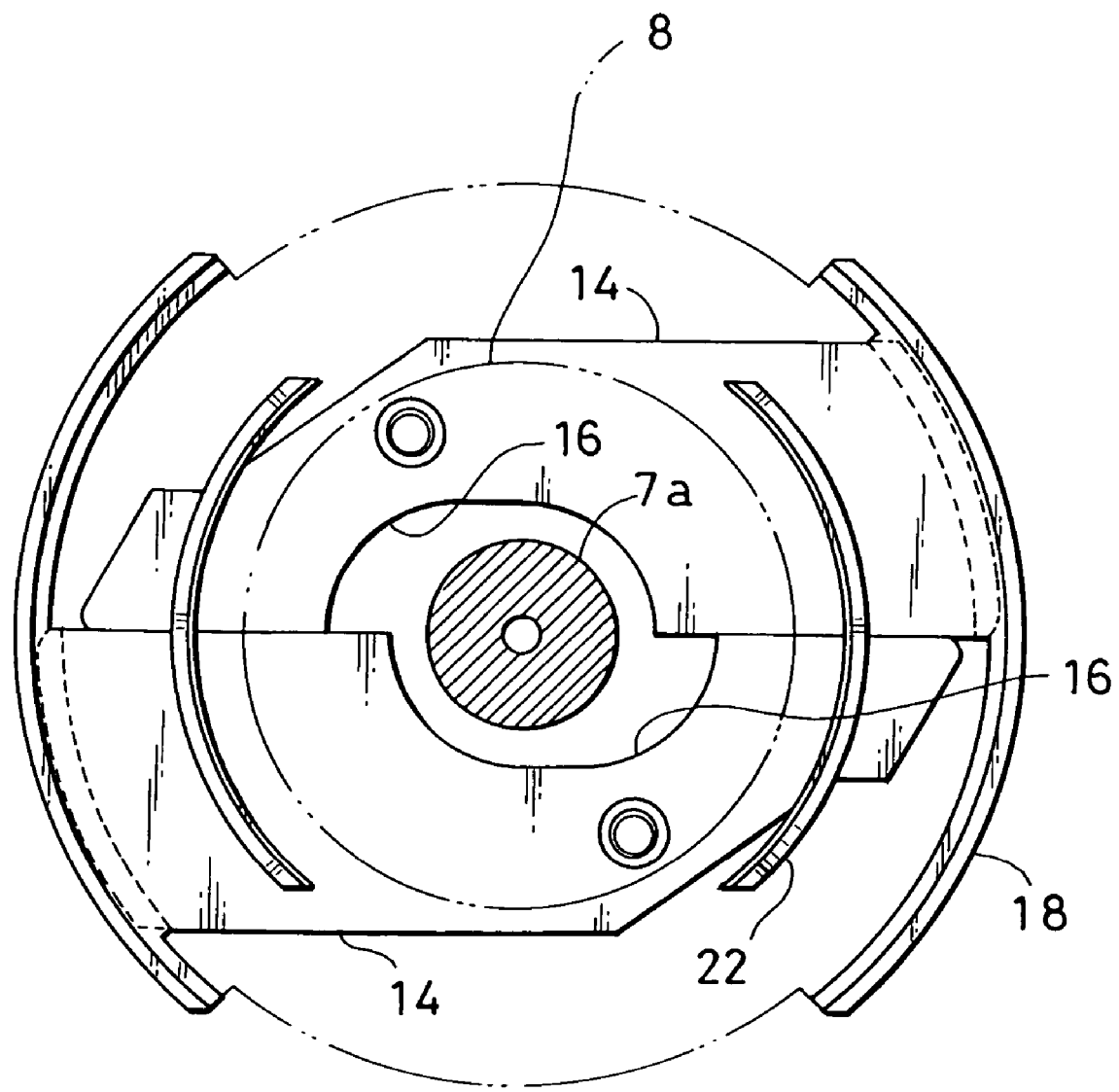
FIG. 6 is an arrow diagram along a line A-A in FIG. 2.

Under the condition that the large-diameter wafer 12 is clamped, the inclined surface of the pawl 18a of the outer clamp pawl 18 is in contact with the peripheral edge of the large-diameter wafer 12 as shown in FIG. 4. By wedge effect, the wafer is perfectly clamped without shakiness even when there may be some variations in outer diameter of the large-diameter wafer 12.

The contact with the large-diameter wafer 12 is kept only with the horizontal surface 9a of the outer positioning seat 9, and contact area between the outer positioning seat 9 and the large-diameter wafer 12 is reduced to prevent contamination of the large-diameter wafer 12. Even when the center of the large-diameter wafer 12 thus transported is extensively deviated and the peripheral edge of the large-diameter wafer 12 is deviated from the horizontal surface 9a, the inclined surface 9b is continuous with the horizontal plane 9a, and alignment can be perfectly achieved.

When the clamping of the large-diameter wafer 12 has been completed, the inspection stage 1 is rotated by the motor 4. Laser beams are projected to the outer wafer sensor 34 and the inner wafer sensor 35. The laser beams are received by the outer wafer sensor 34, and it is judged that the wafer held by the inspection stage 1 has a large diameter, and posture of the large-diameter wafer 12 in a rotating direction is detected.

An orientation flat or a notch is formed on the peripheral edge of the wafer for the purpose of detecting the position in a rotating direction. The posture in a rotating direction of the large-diameter wafer 12 with respect to the wafer table 7 can be detected by detecting the rotating position of the wafer table 7 when the outer wafer sensor 34 receives the light. By finding the posture of the large-diameter wafer 12 in a rotating direction, it is possible to define the position of foreign objects attached on the wafer.

The wafer table 7 is rotated at high speed. The center of gravity of the clamp arm 14 is at a position closer to the outer positioning seat 9 and the clamp arm 14 is rotated around the pivot 15, which is at a position decentered from the rotation shaft 5. When centrifugal force is applied on the clamp arm 14, the clamp arm 14 is pushed toward the clamping direction, and the clamping of the large-diameter wafer 12 is not released during the rotation.

When the small-diameter wafer 13 is clamped, clamping can be achieved in the same manner by placing the wafer on the inner positioning seat 11. The small-diameter wafer 13 placed on the inner positioning seat 11 is at a level lower than the level where the large-diameter wafer 12 is placed.

As descried above, the outer clamp pawl 18 moves extensively in a radial direction. Even when the center position of the wafer transported to the inspection stage 1 is largely deviated, aligning and clamping can be performed. There is no need to perform extra alignment during transportation to the inspection stage 1. This means that neither alignment apparatus nor alignment process is needed.

In the above embodiment, if a wafer positioning seat is provided further on inner side of the inner positioning seat 11 and a clamp pawl is arranged further on inner side of the inner clamp pawl 22 of the clamp arm 14, a wafer with a diameter smaller than that of the small-diameter wafer 13 can be clamped. The guide flange 8 may not be used, and the clamp arms 14 and 14 may be directly and rotatably mounted on the wafer table 7.

Instead of the spring 25 as described above, pushing means such as cylinder may be used. In this case, if the releasing of the clamp is performed by using the cylinder, etc., there is no need to use clamp releasing means such as the plate 29, the releasing pin 31, etc.

What is claimed is:

1. A surface inspection apparatus, comprising a wafer table rotated by a motor, a pair of clamp arms rotatably mounted with respect to the wafer table, pushing means for pushing said clamp arms so as to rotate in the direction toward the center, positioning seats in arcuate shape mounted on said wafer table where a peripheral portion of a wafer is placed, and clamp pawls in arcuate shape coming into contact with a peripheral edge of the wafer, wherein said clamp arms are rotated around positions which are different from the rotation center of said motor, said clamp pawls are separated from the positioning seats when the clamp arm is rotated on a position opposite to the center, and the peripheral edge of the wafer is clamped between said positioning seats and said clamp pawls when the clamp arm is in clamping condition.

2. A surface inspection apparatus according to claim 1, wherein two or more positioning seats with different diameters are arranged on said wafer table concentrically and in multiple circular arrangement, clamp pawls with diameters corresponding to diameters of said positioning seats are provided concentrically and in multiple circular arrangement on said clamp arms, and heights of the positioning seats are gradually reduced toward the center.

3. A surface inspection apparatus according to claim 1, wherein said clamp arm is pushed by centrifugal force so that said clamp arm is rotated in the direction toward the center when centrifugal force is applied on said clamp arm.

4. A surface inspection apparatus according to claim 1, wherein said clamp pawl has a downwardly inclined surface, and the inclined surface comes into contact with the peripheral edge of the wafer.

5. A surface inspection apparatus according to claim 1, wherein said positioning seat has a horizontal surface where the wafer is placed and also has an inclined surface continuous from the horizontal surface toward the center.

6. A surface inspection apparatus according to claim 1, wherein a light passing portion is formed on said wafer table and a wafer sensor with an optical axis passing through said light passing portion is provided so that an edge of the wafer can be detected by said wafer sensor and it is detected whether a wafer is present or not.

7. A surface inspection apparatus according to claim 6, wherein an orientation flat or notch is detected by said wafer sensor, and posture of the wafer in a rotating direction is detected.

* * * * *